United States Patent [19]

Kumar et al.

[11] Patent Number: 4,510,000
[45] Date of Patent: Apr. 9, 1985

[54] METHOD FOR PALLADIUM ACTIVATING MOLYBDENUM METALLIZED FEATURES ON A CERAMIC SUBSTRATE

[75] Inventors: Ananda H. Kumar, Wappingers Falls; Bernard Schwartz, Poughkeepsie, both of N.Y.

[73] Assignee: International Business Machines Corporation, Armonk, N.Y.

[21] Appl. No.: 556,732

[22] Filed: Nov. 30, 1983

[51] Int. Cl.³ .................... C04B 35/00; C04B 39/00
[52] U.S. Cl. ........................ 156/89; 29/840; 29/851; 156/230; 156/239; 427/96; 427/125; 427/126.2
[58] Field of Search .............. 156/89, 230, 239; 427/96, 123, 125, 126.2, 126.5; 29/825, 829, 831, 840, 846, 851; 228/120, 179, 193, 196, 208, 227, 230, 231, 263.18, 263.19

[56] References Cited

U.S. PATENT DOCUMENTS

| | | | |
|---|---|---|---|
| 3,651,567 | 3/1972 | Fenner et al. | 29/851 |
| 3,978,248 | 8/1976 | Usami | 427/96 |
| 3,999,004 | 12/1976 | Chirino et al. | 427/96 |
| 4,340,618 | 7/1982 | Fury et al. | 427/125 |

FOREIGN PATENT DOCUMENTS 2040589 8/1980 United Kingdom ............ 29/851

*Primary Examiner*—Caleb Weston
*Attorney, Agent, or Firm*—Sughrue, Mion, Zinn, Macpeak, and Seas

[57] ABSTRACT

A molybdenum or tungsten metallurgical pattern is formed on or in a dielectric green sheet. Palladium, nickel, platinum or rhodium is coated on a layer of polyvinyl butyral which is carried on a polyester film. The metal layer of this assembly is laminated to a dielectric green sheet which carries the molybdenum or tungsten metallurgy. The polyester film is stripped off. The resulting assembly is sintered to a fired structure, whereby the polyvinyl butyral is volatilized off and the palladium, nickel, platinum or rhodium is alloyed with the molybdenum or tungsten metallurgy to provide a densified metallurgy whose surface is free of glass.

5 Claims, 4 Drawing Figures

METHOD FOR PALLADIUM ACTIVATING MOLYBDENUM METALLIZED FEATURES ON A CERAMIC SUBSTRATE

BACKGROUND OF THE INVENTION

1. Field of the Invention

The present invention relates to a palladium activated sintering process to obtain glass-free refractory metal layers which are firmly secured to a ceramic substrate and which have a top surface that is substantially free of glass.

2. Description of the Prior Art

A relatively recent innovation in electronic packaging has been the development of the multilayer ceramic (hereafter MLC) module. In this technology "green" sheets of ceramic powder held together by a temporary organic binder are metallized with a noble or refractory metal, usually, but not mandatorily, by screen printing. The metallized sheets are stacked, laminated and fired to form a monolithic ceramic-metal package. Details on MLC technology are given in SOLID STATE TECHNOLOGY, May 1972, Vol. 15, No. 5, pages 35-40, Kaiser et al, hereby incorporated by reference. IBM Technical Disclosure Bulletin Vol. 17 No. 8 January 1975 p. 2331 and IBM Technical Disclosure Bulletin Vol. 12 No. 11 April 1970 p. 1795 disclose additional embodiments of related metallurgy for use on ceramic substrates.

Difficulty has been experienced in forming crackfree firmly adherent nickel or other solderable layers on a sintered refractory metal pad which has been subjected to a sintering cycle as above.

U.S. Pat. No. 3,218,194 Maissel discloses a method of stabilizing refractory metal film resistors wherein an oxidation resistant metal including palladium is applied to a refractory metal and the combination is heated in vacuum at an elevated temperature until the oxidation resistant metal film has completely diffused into and substantially filled the grain boundaries of the refractory metal film.

U.S. Pat. No. 3,518,756 Bennett et al discloses a method for forming multilayer ceramic structures wherein an electrode paste which may contain molybdenum and palladium is deposited by a silk screening step to form a desired circuit pattern.

U.S. Pat. No. 3,978,248 Usami discloses a method for manufacturing composite sintered structures wherein polyvinyl butyral is used. Molybdenum is disclosed as a useful conductor powder.

U.S. Pat. No. 3,999,004 Chirino et al discloses a multilayer ceramic substrate structure wherein blind holes in the structure are filled with a diluted metal paste which is about 83% molybdenum.

U.S. Pat. No. 4,109,377 Blazick et al discloses a method for preparing a multilayer ceramic wherein a useful metallizing composition includes molybdenum and a noble metal that can form an oxide, e.g., palladium.

In U.S. Pat. No. 4,340,618 Fury and Kumar, a method is disclosed for obtaining densely sintered refractory metal features free of glass by evaporating or sputtering a thin layer of palladium, etc., on a ceramic substrate prior to densification by sintering. Problems encountered with this method are: the deposition of palladium directly on the surface of the green ceramic blank in a vacuum chamber is an additional process step that is not typically a part of multilayer ceramic module fabrication processing sequences and the vacuum and thermal conditions that prevail during palladium deposition in an evaporator or sputtering machine pose the danger of decomposition and/or out-gassing of organic components of the green ceramic sheets, possibly leading to damage to the green ceramic sheets and to excessive contamination of the vacuum or sputtering systems. This patent is hereby incorporated by reference.

Journal of the Less Common Metals, 58 (1978) 61-74 discloses that on the basis of a grain boundary heterodiffusion model it is shown that Ni and Pd are the best sintering activators for Mo powder when present as coatings approximately 10 monolayers thick on the powdered surface.

IBM Technical Disclosure Bulletin, Vol. 12, No. 11, April 1970, page 1795 discloses that molybdenum can be used to metallize a high alumina green ceramic substrate.

IBM Technical Disclosure Bulletin, Vol. 16, No. 11, April 1974, page 3612 discloses forming a palladium coating on a conductor line on a multilayer ceramic material and then heating to partially diffuse the palladium into the conductor line.

IBM Technical Disclosure Bulletin, Vol. 17, No. 1, June 1974, pages 94-95 discloses placing a thin Mylar ® film on a green ceramic sheet to improve its handling properties and dimensional stability, typically laminating the same at 150° F., and 100-130 psi.

IBM Technical Disclosure Bulletin, Vol. 17, No. 8, January 1975, page 2280, discloses that green sheet instability after screening can be improved by the process which comprises punching locating holes in a suitable release film such as Mylar ®, screening a metal ground plane onto the release film using a mask, drying, transferring the ground plane pattern by aligning the screened pattern onto the release film and then laminating to the shiny surface of the green sheet, peeling off the release film, punching via holes, and screening metal paste into the via holes using a mask.

IBM Technical Disclosure Bulletin, Vol. 17, No. 8, January 1975, page 2331 discloses that the usual practice when soldering Mo is to plate a surface with an intermediate metal such as Pd before soldering.

IBM Technical Disclosure Bulletin, Vol. 19, No. 3, August 1976, page 222 discloses that molybdenum surfaces are conventionally activated for electroless nickel plating by a dip in a palladium chloride solution.

IBM Technical Disclosure Bulletin, Vol. 19, No. 10, March 1977 discloses that high density sintered molybdenum can be used for internal circuit patterns and for the top and bottom side metallurgy of multilayer ceramic modules. The molybdenum metallurgy is protected during sintering by forming a corrosion-resistant nickel-molybdenum layer.

IBM Technical Disclosure Bulletin, Vol. 21, No. 12, May 1979, page 4825 discloses that doctor bladed ceramic green sheets have a high and variable surface porosity. To overcome this problem, a resin coating is applied to the green sheet by coating a plastic film, typically a Mylar ® sheet, and then transferring the coating to the green sheet with a low pressure lamination and peeling the sheet off. When the ceramic green sheet comprises polyvinyl butyral, a thin coating of the same organic material is applied to the Mylar ® after the green sheet has been cast.

SUMMARY OF THE INVENTION

Per the present invention, a completely densified and essentially glass-free surface can be induced to form on the external co-fired molybdenum or tungsten conductive features of a ceramic substrate by the prior treatment of the uppermost unsintered ceramic green sheet with a suitable agent to promote metal sintering. Processing is otherwise in accordance with conventional methods of processing unsintered ceramic green sheets, most preferably a plurality thereof, to yield a final MLC. Sintered ceramic green sheets so treated with the sintering agent will have external circuit features that are densely sintered and free from glassy inclusions or films on their surface so that they can be reliably plated upon with a suitable metal such as nickel or the like or directly brazed to leads, caps etc., with suitable brazing metals and alloys such as copper, copper-palladium, etc., without the need for prior cleaning procedures aimed at glass removal.

The present invention provides a technique of applying a thin sintering agent film to an unsintered ceramic green sheet (hereafter often merely a green sheet of "green" substrate for brevity) having refractory metal metallurgy thereon during lamination of the green sheet to form a stack of green sheets which will eventually yield a multilayer ceramic module. Preferred sintering agents include palladium, nickel, platinum, rhodium, etc. Since the most preferred sintering agent is palladium, the following discussion will be in the context of palladium.

A layer of palladium about 100 to about 300 Angstroms thick is formed on a polyvinyl butyral layer on a polyester sheet.

During lamination of the green sheet stack, the palladium coated side of the polyvinyl butyral coated polyester sheet is brought into intimate contact with the top green sheet and the refractory metal metallurgy thereon.

During lamination the palladium and polyvinyl butyral layers on the polyester sheet will bond to the green sheet surface, and the polyester sheet can be peeled off after lamination.

Upon sintering, the polyvinyl butyral will volatilize or burn off, leaving the palladium on the now sintered "green sheet" to activate the refractory metal metallurgy and eliminate problems associated with glass infiltration into the refractory metal surface.

During sintering, alloying of the palladium with the refractory metal features also causes the surfaces of the refractory metal features to form a more dense structure which is desirable from the viewpoint of further metallization processing, e.g., by chemical or vacuum techniques, to yield a more dense metallic structure.

The presence of a layer of polyvinyl butyral on the green ceramic blank provides yet another important advantage. It enables one to wipe off any dust particles from the surface of the green ceramic blank prior to introduction into a sintering furnace. Without such a protective layer on the green ceramic sheet laminate, such a wiping would cause a smearing of the screened-on refractory metal features. If the dust particles are not removed, they would fuse onto the surface of the refractory metal features during sintering and cause high contact resistance and lead to problems during subsequent plating of nickel and gold layers on the refractory metal features.

Further, since during lamination the polyester will not be in direct contact with the refractory metal features, this minimizes pull-out of refractory metal paste from vias and other surface features during peeling off of the polyester film after lamination. While the following discussion is often in the context of vias, it should be understood that the present invention can be applied with equal force to surface refractory metal features.

It is thus one major object of the present invention to provide a refractory metallurgy layer or via on or in a green sheet which, following sintering, is not in any substantial fashion coated with glass material originating from the green sheet during sintering which would impede good electrical contact therewith from additional layers deposited thereon.

Another major object of the present invention is to provide a process for forming a dependable adherent solderable pad layer on a fired ceramic substrate.

BRIEF DESCRIPTION OF THE DRAWINGS

FIG. 4 schematically illustrates Mylar ® sheet 83 being peeled off the polyvinyl butyral layer 82 with the palladium layer 81 thereunder.

DESCRIPTION OF PREFERRED EMBODIMENTS

Figure 1:
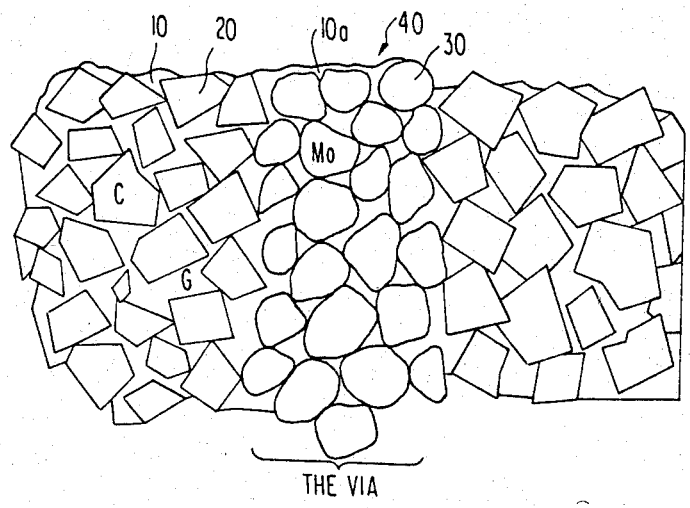
FIG. 1 is a cross-sectional view of a refractory metal via in a multilayer ceramic substrate in a greatly enlarged scale illustrating surface metallurgy treated in accordance with the prior art. In this figure, 10 represents the glassy phase of the ceramic substrate, 20 represents the ceramic phase of the ceramic substrate, 30 represents the metallurgy in the via 40 and 10a represents a layer of the glass phase 10 which is covering the surface of the refractory metallurgy, thereby preventing good electrical contact.
Figure 2:
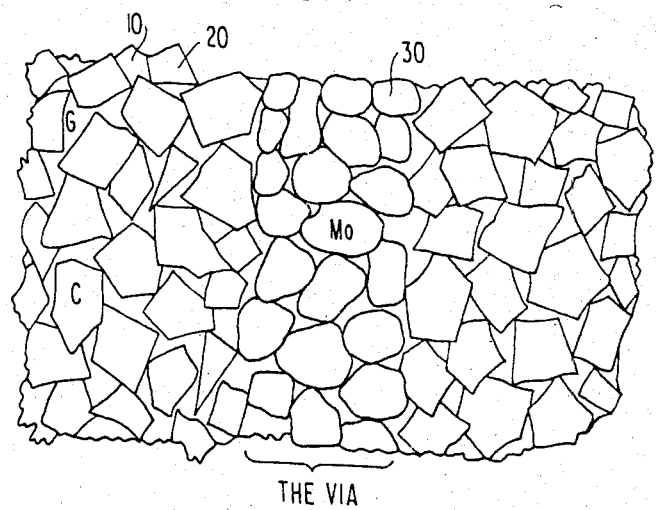
FIG. 2 is a crosssectional view of a refractory metal via in a ceramic substrate in a greatly enlarged scale illustrating surface metallurgy treated in accordance with the method of the present invention wherein numerals have the same meaning as in FIG. 1. It is to be noted that in FIG. 2 the surface layer of the glassy phase 10a is not present, whereby good electrical contact with the surface of the metallurgy is assured.
Figure 3:
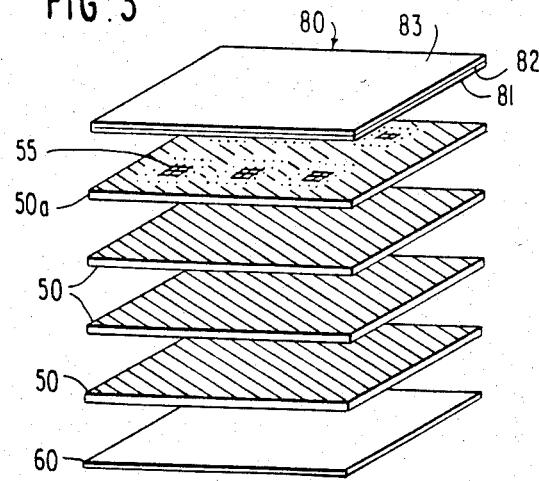
FIG. 3 is a diagram that illustrates the basic process step of the present invention wherein green ceramic substrates are generally shown at 50 wherein the top green ceramic substrate 50a is shown having refractory metallurgy 55 thereon. As will be appreciated by one skilled in the art, interior metallurgy is also provided on the other green ceramic substrates. A conventional Mylar ® sheet 60 is shown at the bottom of the stack of green ceramic substrates and at the top of the stack of green ceramic substrates is shown the palladium application assembly of the present invention 80 comprising lowermost palladium layer 81, intermediate polyvinyl butyral layer 82 and the strippable Mylar ® film 83.
Figure 4:
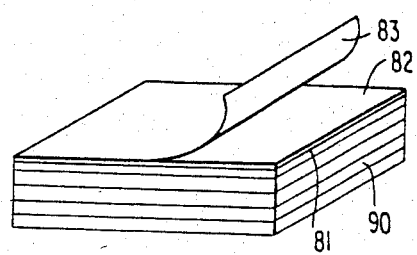
FIG. 4 schematically illustrates the assembly of the green ceramic substrates after lamination where the assembly is generally shown by number 90 (comprising the combination of green ceramic sheets 50 with green ceramic sheet 50a being the top sheet) after the bottom Mylar ® film 83 has been peeled off.

In accordance with the present invention, a process is provided of forming a glass-free surface on a refractory metallurgy pad that is suitable for further plating of metallic layers or other processes following sintering.

The refractory metal is typically molybdenum or tungsten. Since molybdenum is preferred, discussion will hereafter often be with reference to molybdenum but it should be understood that said discussion applies with equal force to tungsten.

The ceramics selected for use in the present invention are not unduly limited, and can be freely selected from ceramic-glass materials as have been used in the prior art to form green unfired ceramic substrates.

The main characteristic which useful ceramic-glasses illustrate per the present invention is that particles thereof can be sintered to a dense body.

Useful ceramics include those as are conventional in the art, for example, alumina, berylia (which has high thermal conductivity but poses a safety hazard), nitrides, carbides, mullite, porcelains, and silica. A preferred ceramic is alumina.

The size of the ceramic particles per the present invention is not overly important and is selected from those sizes as are conventionally used in the art. Typically, this is on the order of from about 2 $\mu$m to about 8 $\mu$m, and this size range can be adjusted by conventional procedures such as ball or vibro-milling, if desired or necessary, to reduce particle size.

Whatever the nature of the ceramic used, in accordance with the present invention such is used in combination with a conventional glass frit such as a calcium, magnesium and aluminum silicate frit which lowers the sintering temperature of the ceramic. The present invention is not, of course, limited to such glass frits and finds application with other glass frits in general since the present invention is basically predicated upon an interaction between a refractory metal and palladium. Typically such frits are used in an amount of about 2 to about 12 weight percent based on the weight of the ceramic.

During sintering the glass frit present in the green substrate will be drawn into vias or into screened metallurgy to form an adhering bond between the refractory metallurgy and the ceramic substrate, which is desired. However, it is not desired that the glass material from the green substrate cover the surface of a via or the surface of any metallurgy present which would prevent good electrical contact. It is the activating layer of palladium on the surface of the refractory metallurgy via or refractory surface features which sinters or fuses into a substantially solid metallurgy layer to prevent the glass material from the substrate from appearing on the surface of the refractory metal to ensure good electrical contact.

The size of the glass frit is not overly important; it is typically similar to that of the ceramic.

The present invention finds particular application with high alumina content green ceramic substrates.

The Polymeric Binder

As is well known in the art, green ceramic substrates are normally formed of a particulate ceramic material in combination with a polymeric binder.

The polymeric binder used in the present invention can be freely selected from those polymeric binders used in the prior art.

The primary characteristics which the polymeric binder of the present invention exhibits is that it be thermoplastic, that it be flexible (typically it contains a plasticizer), it be soluble in the volatile solvent(s) used to cast the same, and it can be sintered-off without any substantial amount of residue during the ceramic sintering cycle. Finally, the polymeric binder sould be permeable to gases to prevent bloating or delamination of a stack of ceramic green sheets during burning-off of the polymeric binder. All of these characteristics are well known in the art.

Preferred polymeric binders include those known in the art, e.g., acetals such as polyvinyl butyral, typically with dioctyl phthalate or dibutyl phthalate as a plasticizer, and generally with a conventional wetting agent and an organic solvent, polysaccharides such as guar gum, typically with glycerol as a plasticizer and water as a solvent, polyamides, polyvinyl alcohols, polyvinyl acetates, polyvinyl chloride, etc.

The currently preferred polymeric binder is polyvinyl butyral in combination with dioctyl phthalate and a conventional wetting agent.

The molecular weight of the polymeric binder is not important per the present invention and can be freely selected from molecular weights as are used in the prior art. As one skilled in the art will appreciate, it is only necessary that the polymeric binder permit easy formation of the slurry which is used to form the green ceramic substrate, provide sufficient strength so that the green sheet may be appropriately handled during processing, and be easily volatilized during sintering to permit clean removal thereof during formation of the fired ceramic substrate.

Solvent

The slurry which is utilized to form the green ceramic sheet per the present invention is typically formed using a solvent. The solvent is selected from those as are conventionally used in the art.

As is well known in the art, the ceramic slurry used to form the green sheet may also contain a mixture of several organic solvents which have different boiling points in the range of about 60° C. to 160° C. Useful solvents typically include water, aliphatic alcohols, ketones and aromatic solvents. A currently preferred mixture is a mixture of ethanol, toluene and cyclohexanone.

Slurry Proportions

The slurry which is utilized to form the green ceramic sheet of the present invention contains proportions of the desired components as are conventional in the art.

While by no means limitative, typically this will be from about 55 to about 70 weight percent ceramic particles, from about 5 to about 8 weight percent polymeric binder, and from about 25 to about 40 weight percent solvent.

Slurry/Green Ceramic Sheet Formation

The slurry and the green ceramic sheet per the present invention are formed following conventional prior art procedures except, of course, for the embossing step of the present invention which is not disclosed in the prior art and is later discussed in more detail.

Reference should be made to the Kaiser et al article earlier incorporated by reference and to U.S. Pat. No. 4,237,606 Niwa et al also hereby incorporated by reference for disclosure regarding such.

Typically, however, the desired ceramic materials(s) is/are weighed out in the proper proportion, particle size is adjusted if desired or necessary, the constituents of the organic binder such as the desired thermoplastic resin, a plasticizer and the solvent(s) are separately blended and then the ceramic phase and the organic phase are weighed out and blended in a ball mill, the resulting slurry (often called a slip) is cast into tape form by doctor blading onto a web of Mylar ®, the blade spreading the slurry into a uniform film. After the slurry is spread out on the Mylar ® web, it is typically allowed to remain until enough of the solvent has evaporated so that the slurry will not flow when moved. The thus partially dried slurry is allowed to completely dry and is then removed from the Mylar ® backing and is ready for use in subsequent operations.

Since typically the green ceramic sheet at this time is rather large in size, usually working blanks are cut from the green ceramic sheet and via holes are selectively punched in a standard grid pattern in the thus formed working blank.

At this stage, the desired molybdenum metallized features can be formed on the top green sheet in a conventional manner, e.g., by silk screening using a conventional metal paste, e.g., particulate molybdenum in a conventional organic binder system. The metal paste can be any suitable type that includes molybdenum or tungsten and a vehicle. For example, the type disclosed in IBM Technical Disclosure Bulletin Vol. 22, No. 4, September 1979, p. 1435. The metal particles in the paste preferably have a size in the range of 15 microns. The vehicle is typically present in the paste in an amount of 75 to 85% by weight of the metal particles. The paste can be applied with any suitable apparatus, for example, by the apparatus described in U.S. Pat. No. 3,384,931. Dimensions of the applied paste area(s) are in accordance with the prior art. Typically the metalization pattern will have a thickness of from about 0.5 to 5 mils; vias are, of course, the thickness of the green sheet.

At this stage the palladium-polyvinyl butyral polyester assembly of the present invention is contacted with the green sheet which is to be the top green sheet in the final multilayer ceramic module with, of course, the palladium layer in contact with the metallized features of the uncoated surfaces of the green sheet.

Usually two silk screening operations are used. In a first step via holes are partially filled with the metal paste from the bottom using a generalized via fill pattern and in a second step the filling of the via holes from the top is completed and at the same time the circuit pattern is screened on the top of the working green sheet blank.

After the procedure of the present invention is conducted, typically a stack of green ceramic blanks will be formed which will become the final module.

Generally, a set of working blanks is stacked over registration pins in the proper sequence, the stack is placed in a laminating press and moderate heat and pressure applied, e.g., typically from about 1500 to about 3000 psi and about 70° to about 90° C. for about 1 to about 15 minutes, whereupon the thermoplastic binder in the green sheet blank softens and the layers fuse together, deforming around the internal metallization pattern to completely enclose the lines.

Following the above lamination, the polyester sheet can be peeled off leaving the palladium layer in intimate contact with the molybdenum metallization features and the green sheet with the polyvinyl butyral layer thereover.

Following the above procedure, the "green substrate" is fired, typically at about 1350° to about 1650° C. for about 16 to about 24 hours in an atmosphere such as wet hydrogen in a conventional manner, whereupon the polyvinyl butyral is volatilized or burned off and the palladium is alloyed with the molybdenum metallization features.

The mechanism of sintering catalysis is believed to be the enhanced surface diffusion of molybdenum or tungsten atoms in a thin palladium-rich surface layer.

The resultant sintered metal areas thus have a substantially glass-free top surface that is conducive to further processing by plating additional metal layers, or bonding to associated elements, while allowing for glass infiltration of the lower portion adjacent the interface of the area which results in a firm, strong bond. Thus, the molybdenum or tungsten grains at the surface are very dense, denoting a substantially pure metal layer free of glass, the grain structure changing with depth to indicate a mixture of glass and metal particles where the sintering action is much less complete.

The substrate is now ready for various post-sintering operations which are conventional in the art and which are disclosed in detail in the Kaiser et al article earlier incorporated by reference.

Turning now to the palladium-polyvinyl butyral polyester assembly of the present invention in more detail, the polyvinyl butyral enables bonding of the palladium layer to the green ceramic blank and facilitates easy parting of the polyester from the laminate without tearing of the palladium layer since the polyvinyl butyral does not adhere to the polyester after the lamination process.

During the lamination process, the heat and pressure applied cause microfissuring in the palladium layer and the polyvinyl butyral flows through the microfissures to establish contact with and bonding to the green sheet surface and the molybdenum thereon. The microfissuring of the palladium layer is inconsequential to the subsequent action of the palladium during sintering.

During sintering where the green sheet assembly is heated in a controlled atmosphere of hydrogen or another reducing gas, the polyvinyl butyral layer will depolymerize and volatilize off the laminate surface at temperatures below about 1100° C., the thermal decomposition characteristics of the polyvinyl butyral being similar to those of the organic binders used in forming the green sheet assembly.

The palladium layer will remain on the green sheet surface to a considerably higher temperature, e.g., on the order of 1400° C. In the temperatures between thermal decomposition of the polyvinyl butyral and 1400° C., the palladium on the molybdenum metallization features will cause the molybdenum metal particles to sinter early in the process and densify, forming a surface skin on the molybdenum which is impervious to glass infiltration from the ceramic phase of the ceramic substrate at higher temperatures in the sintering cycle at which the glass will be fluid.

The palladium which has been deposited over regions where there is no molybdenum present eventually volatilizes off during the sintering process.

The thickness of the polyester substrate (which is typically the polyethylene terephthalate available from duPont under the tradename Mylar ®) is not limited in any substantial fashion so long as the same can be peeled off from the polyvinyl butyral and the same provides sufficient dimensional stability to the palladium layer so that the same is not disrupted during handling. Usually the polyester film is on the order of about 125 to about 250 micrometers ($\mu$m) thick.

The thickness of the polyvinyl butyral layer between the palladium layer and the polyester film is typically between about 2 to about 10 microns. The lower limit is dictated by considerations such as ease of coating and the need for assuring complete coverage of the polyester surface. The upper limit is dictated by the need to conserve the polyvinyl butyral as well as to prevent warpage of the polyester film that would occur with thicker coatings.

The polyvinyl butyral can be applied in a conventional fashion such as knife coating, web coating, etc. It is typically applied to the polyester film in a solvent such as methyl alcohol usually using a concentration of about 20 to about 40 weight percent of polyvinyl butyral, based on the coating solution.

It is typically dried at room temperature in air.

After drying, the palladium layer is deposited in a conventional manner, for instance, vacuum deposition, sputtering or the like. As earlier indicated, the palladium layer is most preferably about 100 to about 300 Angstroms thick.

The molecular weight of the polyvinyl butyral is not overly important and is typically on the order of about 30,000 about 100,000, measured by the light scattering method (number average molecular weight). The molecular weight merely need be such that upon drying the polyvinyl butyral casting solution leaves a thin solid layer which can be volatilized off during the sintering process.

Having thus generally described the invention, the following working example is given to illustrate a currently preferred mode of practicing the invention.

EXAMPLE 1

In this example, the final sintered MLC comprised 10 layers, each layer being 140 μm thick and having the following dimensions: 50 cm×50 cm. The ceramic material used was conventional and comprised 92 wt.% $Al_2O_3$ and 8 wt.% silicate frit (Ca, Mg, Al silicates). The average particle size thereof was 4 μm.

The binder selected was conventional and comprised a mixture of polyvinyl butyral (Butvar ® from Monsanto), dioctyl phthalate as a plasticizer and Tergitol ® as a wetting agent.

The solvents selected were conventional and comprised a mixture of cyclohexamine, ethanol and toluene.

The ceramic frit, binder and solvent were then ball milled in a conventional fashion.

A green sheet having a thickness of 200 μm was produced from the slurry obtained using a conventional doctor blading method.

The green sheet was then dried in air for 12 hours, whereafter the same was cut into working blank having the following dimensions: 185×185 mm, and registration holes were punched therein in a conventional manner.

Thereafter, via holes having a diameter of 125 μm were selectively punched on a standard grid pattern in each working blank.

Following the above procedure, the via holes were filled from the bottom and then the top in a conventional manner using a metallization paste, which contained 80 wt.% molybdenum particles, balance organic vehicle.

Thereafter, a wiring pattern was formed by printing the metallization paste on each working blank in a conventional manner to a thickness of 0.5 to 5 mils., forming the desired metallization pattern on the working blanks such as redistribution layers, ground planes, etc. For an example of a typical intermediate product at this stage, see Microelectric Packaging, Scientific American, July, 1983, for example, at page 87.

Separately from the above procedure, a Mylar ® film approximately 200 μm thick had coated thereon a 30 weight percent solution of polyvinyl butyral (Butvar ® from Monsanto), whereafter the same was dried at 25° C. for 30 minutes in air, yielding a polyvinyl butyral layer 5 μm thick (dry thickness).

Following the above procedure, palladium was sputtered on the polyvinyl butyral layer to a thickness of 300 Å in a conventional manner.

The palladium layer of the resulting assembly was placed over the entire surface of the top green sheet so that the same was in contact with the molybdenum metallization features thereon and in contact with uncoated areas of the top green ceramic working blank.

The upper and lower platens of the hydraulic press were heated by resistance heating to 75° C. The stack of ceramic green sheets was placed on the lower platen with the Mylar ® sheet in contact with the upper platen.

The lower platen of the press was pushed upward against the upper platen, thereby effecting lamination of the assembly at 1000 psi for one minute.

Following separation of the platens, the laminated assembly was removed from the platens and the Mylar ® film stripped from the underlying polyvinyl butyral/palladium layers which were firmly adhered to the ceramic green sheets; removal was clean and essentially none of the polyvinyl butyral adhered to the Mylar ®.

Following the above, the ceramic green working blank stack was sintered at 1560° C. for 16 hours in a water vapor and hydrogen atmosphere.

During the sintering, the polyvinyl butyral cleanly vaporized, as did the palladium which was not in contact with the molybdenum metallized features.

The remaining palladium over the molybdenum metalized features had alloyed with the same to yield a highly densified glass-free structure.

While the invention has been described in detail and with reference to specific embodiments thereof, it will be apparent to one skilled in the art that various changes and modifications can be made therein without departing from the spirit and scope thereof.

We claim:

1. A process for coating a molybdenum or tungsten metallurgical pattern on or in a dielectric green sheet with palladium, nickel, platinum or rhodium which comprises:

coating palladium, nickel, platinum or rhodium on a polyvinyl butyral resin layer on a polyester film;

superimposing said polyester coated film on the dielectric green sheet with the palladium, nickel, platinum or rhodium coating adjacent the molybdenum or tungsten metallurgical pattern and the dielectric green sheet;

laminating the resulting assembly;

stripping the polyester film therefrom while permitting the polyvinyl butyral layer and palladium, nickel, platinum or rhodium layer to remain on the molybdenum or tungsten metallurgical pattern and the dielectric green sheet;

sintering the resulting composite to a fired structure, whereby said polyvinyl butyral is volatilized off and said palladium, nickel, platinum or rhodium is alloyed with the molybdenum or tungsten metallurgical pattern to result in a densified structure.

2. The process of claim 1 wherein the metallurgical pattern is molybdenum and the metal coated thereon is palladium.

3. The process of claim 2 wherein the dielectric green sheet comprises a ceramic and a glass frit.

4. The process of claim 3 wherein the ceramic is alumina and the glass frit comprises calcium, magnesium and aluminum silicates.

5. The process of claim 4 wherein from 2 to 12 weight percent of the glass frit is present based on the weight of the ceramic plus the glass frit.

* * * * *